(12) United States Patent
Ohguro (10) Patent No.: US 7,176,529 B2
(45) Date of Patent: Feb. 13, 2007

(54) SEMICONDUCTOR DEVICE AND METHOD OF MANUFACTURING THE SAME (75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/847,314

(22) Filed: May 18, 2004

(65) Prior Publication Data

US 2005/0199955 A1    Sep. 15, 2005

(30) Foreign Application Priority Data

Mar. 11, 2004   (JP) ............................. 2004-068912

(51) Int. Cl.
*H01L 23/62*    (2006.01)
(52) U.S. Cl. ................ 257/357; 257/356; 257/E29.345
(58) Field of Classification Search ................ 257/355, 257/356, 339, 357, 487, E29.345
See application file for complete search history.

(56) References Cited

U.S. PATENT DOCUMENTS

| 5,055,905 | A | * | 10/1991 | Anmo | 257/532 |
| 5,598,018 | A | * | 1/1997 | Lidow et al. | 257/342 |
| 5,736,767 | A | * | 4/1998 | Yoshitomi et al. | 257/344 |
| 5,867,418 | A | * | 2/1999 | Okasaka et al. | 365/52 |
| 6,037,238 | A | * | 3/2000 | Chang et al. | 438/426 |
| 6,573,656 | B2 | * | 6/2003 | Clevenger et al. | 257/355 |
| 6,583,475 | B2 | * | 6/2003 | Makita et al. | 257/355 |
| 6,586,807 | B2 | * | 7/2003 | Nishida et al. | 257/401 |
| 6,683,351 | B2 | * | 1/2004 | Morita et al. | 257/355 |

FOREIGN PATENT DOCUMENTS

| JP | 02-037775 | 2/1990 |
| JP | 05-090286 | 4/1993 |
| JP | 11-274404 | 10/1999 |
| JP | 2002-280552 | 9/2002 |
| JP | 2003-51581 | 2/2003 |
| JP | 2003-258200 | 9/2003 |
| JP | 2003-258212 | 9/2003 |

OTHER PUBLICATIONS

Device Electronics Fot Integrated Circuits,Second Edition, Richard S.Muller, Theodore L/Karmins, 1986.*
Min Park, et al., "Optimization of High Q CMOS-Compatible Microwave Inductors Using Silicon CMOS Technology", IEEE MTT-S Digest, 1997, pp. 129-132.
T. Ohguro, et al., "High Performance Digital-Analog Mixed Device on a Si Substrate with Resistivity Beyond 1KΩ CM", IEDM, 2002, pp. 757-760.

* cited by examiner

*Primary Examiner*—Evan Pert
*Assistant Examiner*—Victor A. Mandala, Jr.
(74) *Attorney, Agent, or Firm*—Oblon, Spivak, McClelland, Maier & Neustadt, P.C.

(57) ABSTRACT

A semiconductor device includes a semiconductor substrate having a resistivity of at least 30 Ω·cm, a first MISFET formed on the semiconductor substrate to function as a protective element, and a second MISFET protected by the first MISFET.

20 Claims, 10 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-068912, filed Mar. 11, 2003, the entire contents of which are incorporated herein by reference.

BACKGROUND OF THE INVENTION

1. Field of the Invention

The present invention relates to a semiconductor device comprising a protective element and a method of manufacturing the semiconductor device.

2. Description of the Related Art

In recent years, with a change in CMOS generation, gate insulating films have become thinner. Accordingly, the application of an external high voltage may cause the gate insulating film to be easily broken down. To prevent this breakdown, a protective element is located in an input section so as to be operated to allow a current to flow before a high voltage is applied to an internal circuit.

An important point for the prevention of dielectric breakdown is the voltage at which the protective circuit starts to operate. This is because the voltage at which the internal circuit is broken down decreases as the generation changes, so that the operating voltage of the protective element must be reduced as the generation changes. However, in the prior art, means for reducing the operating voltage of the protective circuit is unknown.

Prior art document information relating to the present invention is listed below.
[Patent Document 1] Jpn. Pat. Appln. KOKAI Publication No. 11-274404
[Patent Document 2] Jpn. Pat. Appln. KOKAI Publication No. 2002-280552
[Patent Document 3] Jpn. Pat. Appln. KOKAI Publication No. 2003-51581

BRIEF SUMMARY OF THE INVENTION

A semiconductor device according to a first aspect of the present invention comprises a semiconductor substrate having a resistivity of at least 30 Ω·cm, a first MISFET functioning as a protective element, and a second MISFET protected by the first MISFET.

A method of manufacturing a semiconductor device according to a second aspect of the present invention comprises forming a first MISFET functioning as a protective element on a semiconductor substrate having a resistivity of at least 30 Ω·cm and forming a second MISFET protected by the first MISFET.

DETAILED DESCRIPTION OF THE INVENTION

Embodiments of the present invention will be described below with reference to the drawings. In this description, common parts are denoted by common reference numerals throughout the drawings.

First Embodiment

Figure 28:
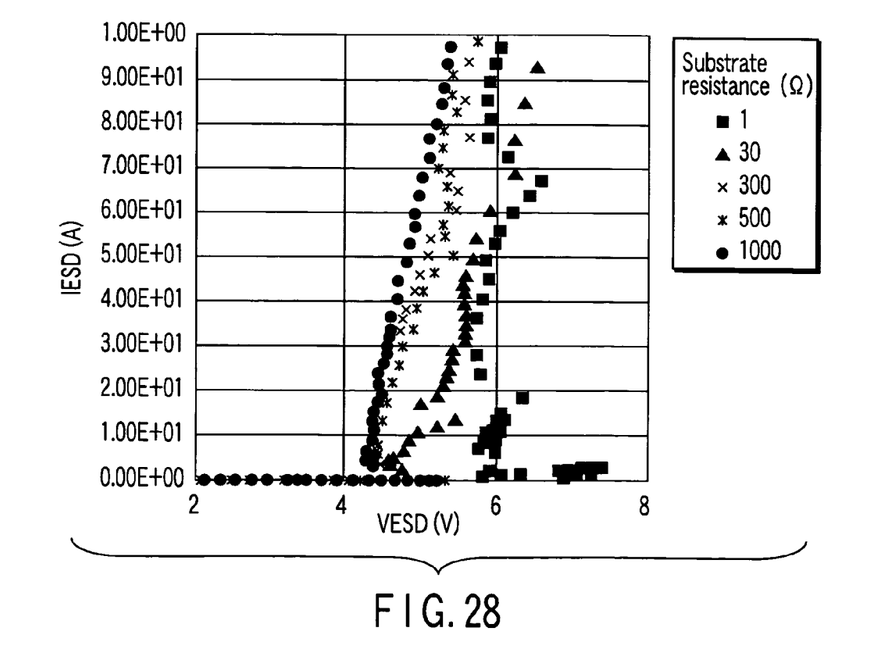
FIG. 28 is a graph showing the relationship between an input voltage VESD and an output current IESD.

A GGNMOS (Grounded Gate NMOS) was examined as an example of an ESD (Electro Static Destruction) element that is a protective element. As a result, it has been found that the operating voltage of the protective element varies depending on the as shown in FIG. 28. Thus, in a first embodiment, a semiconductor substrate of substance resistivity 30 Ω·cm or more is used to reduce the operating voltage of the protective element.

In such GGNMOS, when a high voltage is applied to the drain, a current resulting from hot carriers or an avalanche starts to flow from the drain. The current becomes a base current for an NPN bipolar formed of the source, well, and drain. Thus, the NPN bipolar starts to operate to cause the current to flow from the drain to the source. In this manner, before a high voltage is applied to an internal circuit, the protective element (GGNMOS) starts to operate to cause the current to flow. How the GGMOS operates is detailed in, for example, Jpn. Pat. Appln. No. 2003-258200.

Figure 1:
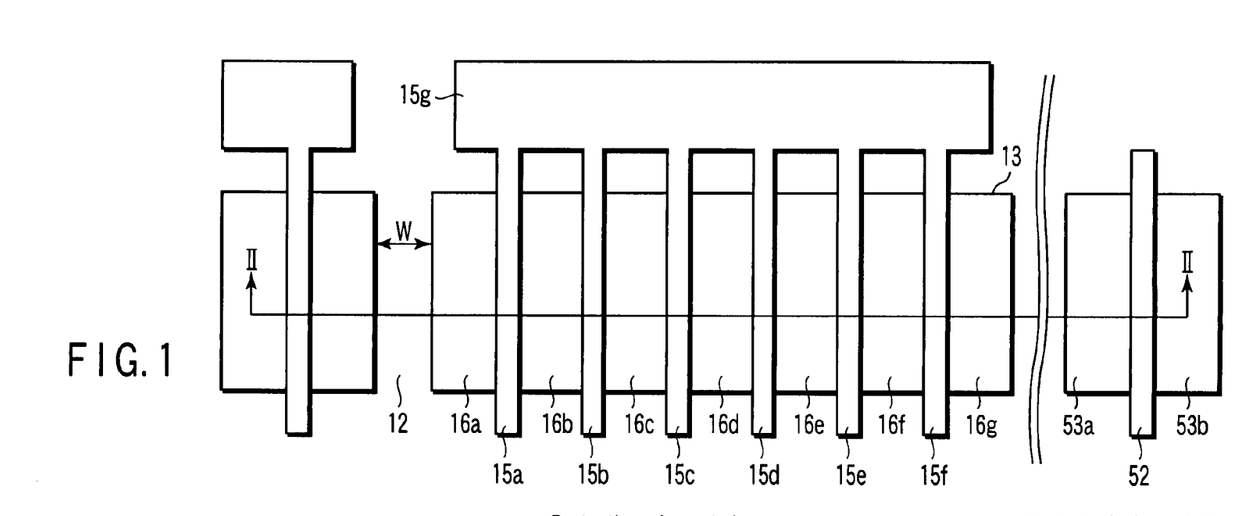
FIG. 1 is a plan view showing a semiconductor device according to a first embodiment of the present invention.
Figure 2:
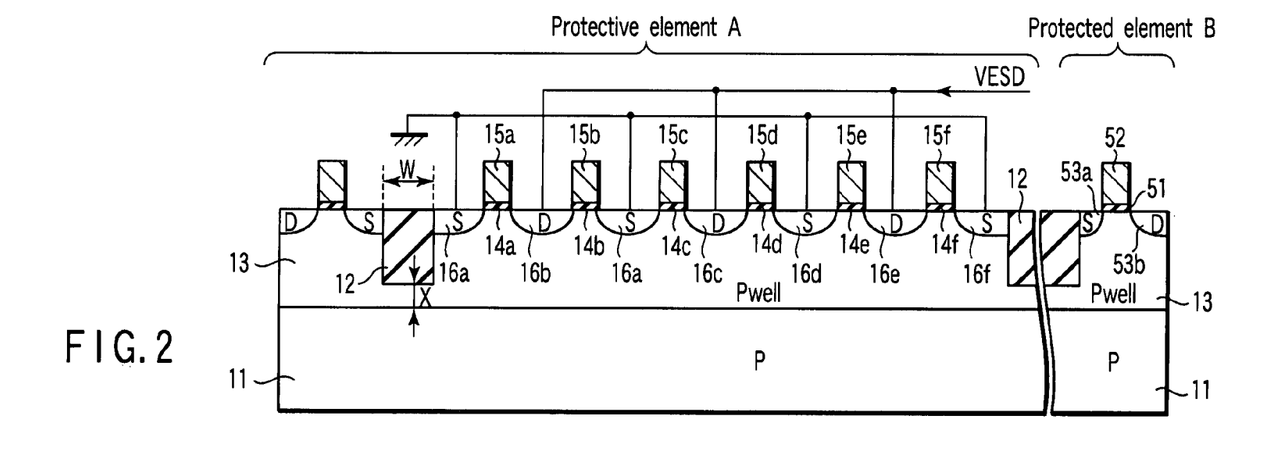
FIG. 2 is a sectional view of a semiconductor device taken along line II—II of FIG. 1.
Figure 3:
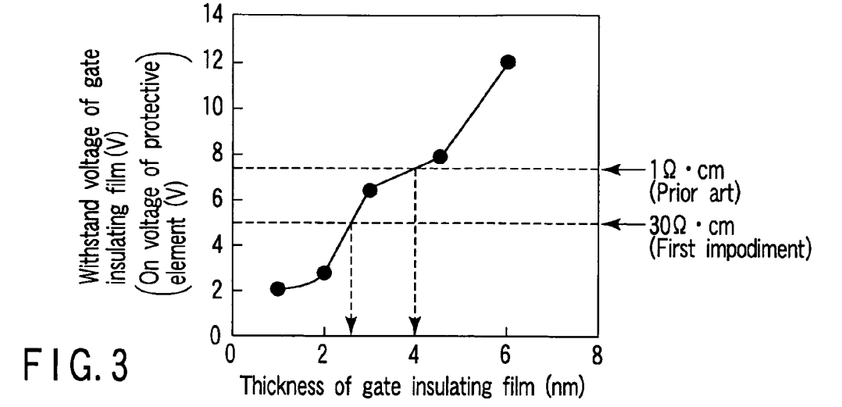
FIG. 3 is a graph showing the relationship between the thickness and withstand voltage of a gate insulating film of a protected element according to the first embodiment of the present invention.

FIG. 1 is a plan view of a semiconductor device according to a first embodiment of the present invention. FIG. 2 is a sectional view of the semiconductor device taken along line II—II in FIG. 1. FIG. 3 is a graph showing the relationship between the thickness and withstand voltage of a gate insulating film in a protected element according to the first embodiment of the present invention. Description will be given of the structure of the semiconductor device according to the first embodiment. Here, as a protective example A, a GGNMOS will be described by way of example.

As shown in FIGS. 1 and 2, in the first embodiment, a semiconductor substrate (for example, a P-type silicon substrate) 11 is used which has a resistivity of at least 30 Ω·cm. In this semiconductor substrate 11, a MOS transistor is formed as a protected element B. Furthermore, a GGNMOS transistor is formed as a protective element A that protects the element B.

In the area in which the protective element A is formed, a P-well layer 13 is formed on a surface of the semiconductor substrate 11. Furthermore, gate electrodes 15a, 15b, 15c, 15d, 15e, and 15f are formed on the semiconductor substrate 11 via gate insulating films 14a, 14b, 14c, 14d, 14e, and 14f, respectively. N-type source/drain regions 16a, 16b, 16c, 16d, 16e, 16f, and 16g are formed on a surface of the P-well layer 13 under opposite ends of the gate electrodes 15a, 15b, 15c, 15d, 15e, and 15f, respectively. The gate electrodes 15a, 15b, 15c, 15d, 15e, and 15f are formed in parallel so as to be striped. One end portions of the gate electrodes 15a, 15b, 15c, 15d, 15e, and 15f are connected together outside an element region (a P-well layer 13) using a gate electrode connecting section 15g. A source, a well, and a gate are connected to a ground. The drain constitutes an input section to which a voltage VESD is input. A GGNMOS transistor is formed on the semiconductor substrate 11 of resistivity at least 30 Ω·cm to function as the protective element A.

Here, the semiconductor substrate 11 has a resistivity of at least 30 Ω·cm as described above. If the resistivity of the semiconductor substrate 11 is defined as R1 and the resistivity of the P-well layer 13 is defined as R2, then the ratio of the resistivity R1 to the resistivity R2 desirably meets the relationship expressed by Expression (1).

$$R1/R2 \geq 100 \quad (1)$$

For example, if the resistivity R1 of the P-type semiconductor substrate 11 is at least 30 Ω·cm and the resistivity R2 of the P-well layer 13 is $6.2 \times 10^{-2}$ Ω·cm, then the ratio of the resistivity R1 to the resistivity R2 is $R1/R2 \geq 483.8$.

To electrically separate adjacent element regions from each other, an element isolating region 12 of an STI (Shallow Trench Isolation) structure is formed in the P-well layer 13. In this case, the width W of the element isolating region 12 in a horizontal direction with respect to the semiconductor substrate 11 may be set at, for example, 2 μm. The distance X from the bottom surface of the element isolating region 12 to the bottom surface of the P-well layer 13 may be set at, for example, 1 μm. In this manner, to make the resistance of the protective element A under the element isolating area 12 constant, the width W and the distance X desirably meets the equation expressed by Expression (2).

$$X \leq \tfrac{1}{2}W \quad (2)$$

In the region where a protected element B is formed, the semiconductor substrate 11 of resistivity at least 30 Ω·cm is used as in the case of the region where the protective element A is formed. The P-well layer 13 is formed in the surface of the semiconductor substrate 11. A gate electrode 52 is formed on the semiconductor substrate 11 via a gate insulating film (for example, an oxide film) 51. N-type source/drain regions 53a and 53b are formed in the surface of the P-well layer 13 under the respective ends of the gate electrode 52. In this manner, a MOS transistor is formed as the protected element B.

The on-voltage (operating voltage) of the element A varies with the resistivity of the semiconductor substrate 11. How much the thickness of the gate-insulating film 51 of the element B against the on-voltage can be decreased will be explained with reference to FIG. 3. If the substrate 11 has resistivity of 30 Ω·cm or more, the on-voltage can be reduced to about 5V. If the resistivity is f less than 30 Ω·cm (e.g., 1 Ω·cm), the on-voltage may be about 7.5V (see FIG. 7). The conventional protective element cannot work unless it is applied with a high voltage of about 7.5V. Hence, the gate-insulating film of the protected element cannot be made as thin as 4.0 nm or less, because it may undergo dielectric breakdown if is so thin. In the first embodiment of this invention, because the resistivity of the semiconductor substrate 11 increases from 1 to 30 Ω·cm or more, the on-voltage can therefore be as low as 5V. This makes it possible to decrease the thickness of the gate-insulating film of the element B from 4.0 to 2.2 nm. Even if the gate-insulating film 51 is 4.0 nm or less thick, it can be free from breakdown since the resistivity of the substrate 11 is 30 Ω·cm or more.

Furthermore, provided that the gate insulating film 51 of the protected element B has a thickness of, for example, about 4.0 nm, the gate electrode may have a gate length of, for example, 0.18 μm or less.

Figure 4:
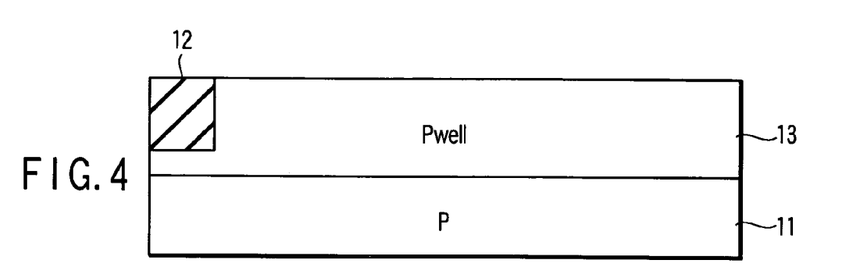
FIGS. 4 to 6 are sectional views showing a process of manufacturing a semiconductor device according to the first embodiment of the present invention.
Figure 5:
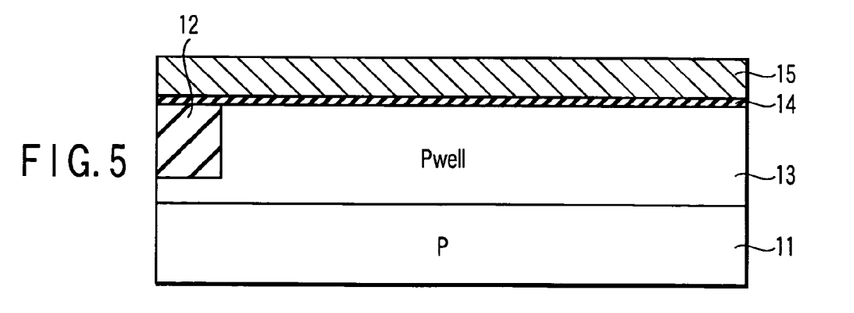
Figure 6:
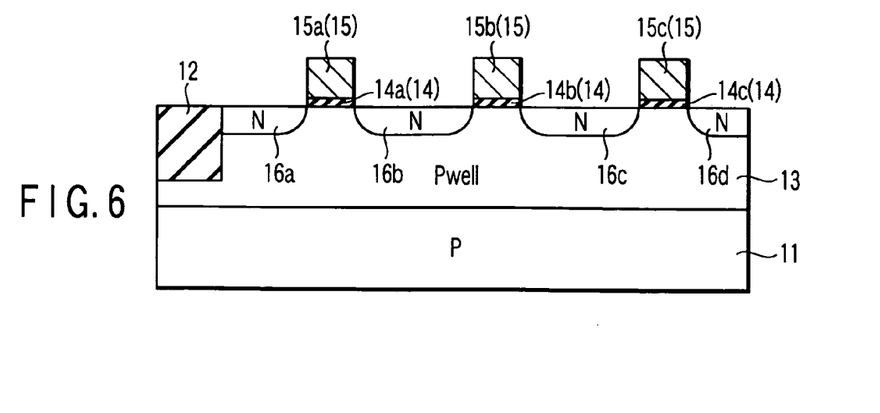

FIGS. 4 to 6 are sectional views of a process of manufacturing a semiconductor device according to the first embodiment of the present invention. Description will be given below of the method of manufacturing a semiconductor device according to the first embodiment.

First, as shown in FIG. 4, the semiconductor substrate (for example, P-type silicon substrate) 11 of resistivity at least 30 Ω·cm is provided. The element isolating region 12 composed of an insulating film is formed in the semiconductor substrate 11. The P-well layer 13 and a channel region (not shown) are formed in the semiconductor substrate 11.

Then, as shown in FIG. 5, the gate insulating film 14 is formed on the semiconductor substrate 11. The gate electrode material 15 is formed on the gate insulating film 14.

Then, as shown in FIG. 6, the gate insulating film 14 and the gate electrode material 15 are patterned. The gate electrodes 15a, 15b, and 15c are formed on the semiconductor substrate 11 via the gate insulating films 14a, 14b, and 14c. Subsequently, the N-type source/drain regions 16a, 16b, 16c, and 16d are formed in the P-well layer 13 under opposite ends of the gate electrodes 15a, 15b, and 15c, respectively. Thus, a MISFET is formed.

Figure 7:
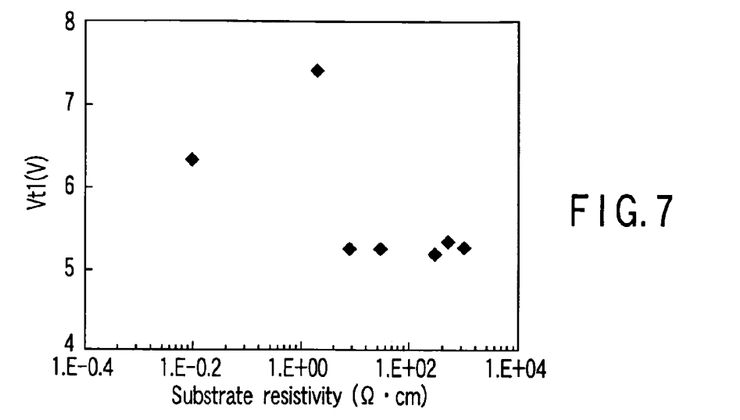
FIG. 7 is a graph showing the relationship between the resistivity and operating voltage Vt1 of a substrate according to the first embodiment of the present invention.
Figures 8, 9, 10:
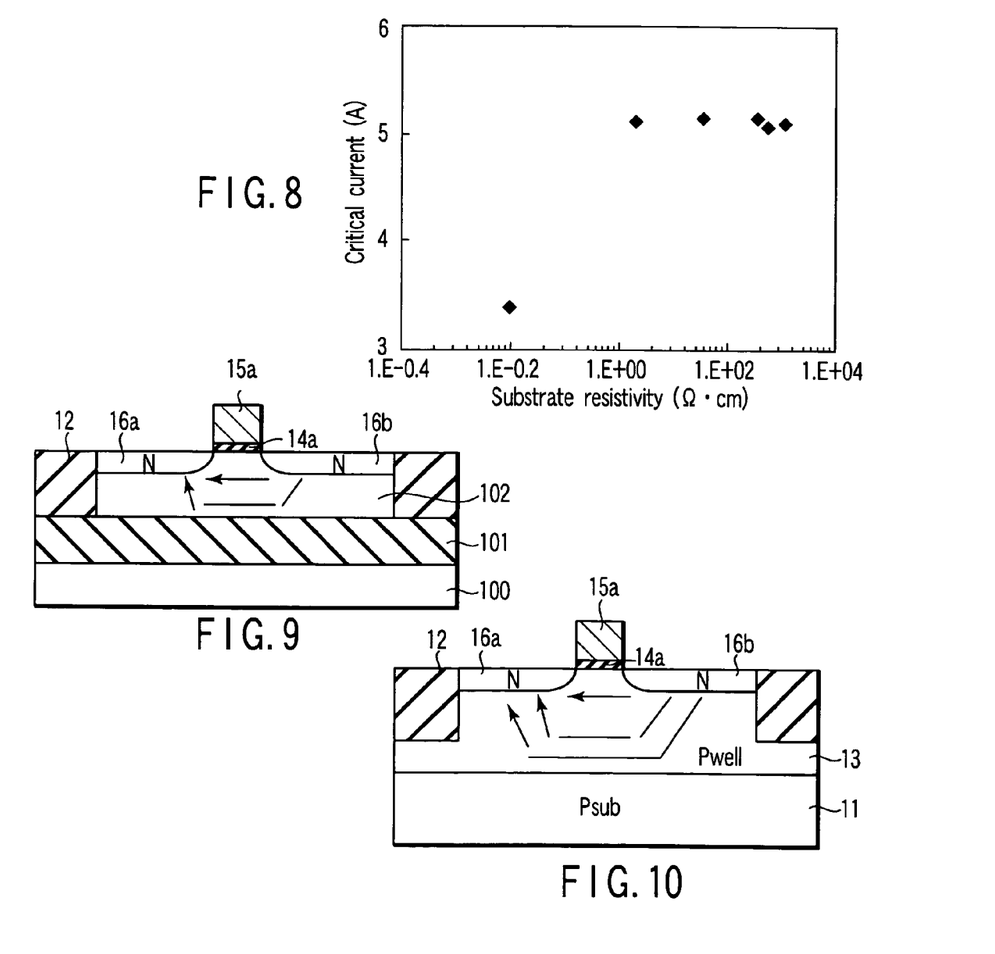
FIG. 8 is a graph showing the relationship between the substrate resistivity and a critical current through an ESD element according to the first embodiment of the present invention.
FIG. 9 is a sectional view of a semiconductor device using an SOI substrate according to the first embodiment of the present invention.
FIG. 10 is a sectional view of a semiconductor device using a bulk substrate according to the first embodiment of the present invention.

FIG. 7 shows the relationship between the resistivity and operating voltage Vt1 of the substrate according to the first embodiment of the present invention. FIG. 8 shows the relationship between the surface resistivity and a critical current in the ESD element.

The experimental data in FIG. 7 indicates that the operating voltage (on voltage) Vt1 increases consistently with the surface resistivity, the operating voltage Vt1 becomes 7.5V when the substrate resistivity becomes about 1 Ω·cm. And the operating voltage Vt1 starts to decrease once the substrate resistivity reaches about 30 Ω·cm, and then becomes almost fixed about 5V. The experimental data in FIG. 8 indicates that the critical current It2 increases consistently with the substrate resistivity but remains substantially fixed about 5 A after the substrate resistivity reaches about 30 Ω·cm. These experimental results in FIGS. 7 and 8 indicate that the substrate resistivity may be set at 30 Ω·cm or more in order to reduce the operating voltage Vt to allow the critical current It2 to flow.

In this case, the substrate with the high resistance serves to reduce the operating voltage Vt1 for the following reason. If the substrate offers a high resistance when the protective element A is partially operated, a long time is required to reduce the well voltage. The substrate can be used as a trigger for parts located in proximity to the first operated region. This reduces the time required to operate the whole GGNMOS to enable a reduction in voltage Vt1 required to start operations.

According to the above described first embodiment, the use of the semiconductor substrate 11 of resistivity 30 Ω·cm enables trigger efficiency to be increased to reduce the operating voltage of the protective element A. Thus, even if the gate insulating film 51 of the protected element B is thinner, the element B is prevented from dielectric breakdown. In this case, the thickness of the gate insulating film 51 of the protected element B can be reduced, for example, from 4.0 to 2.2 nm as described above. Accordingly, a high-resistance substrate such as the one according to the first embodiment is very effective in protecting an element having a gate insulating film that is less than 4.0 nm in thickness.

An SOI (Silicon On Insulator) substrate produces similar effects in an increase in substrate resistance. However, if an SOI substrate is used (FIG. 9), a silicon layer 102 is thin compared to the case in which a bulk substrate is used (FIG. 10) as in the case of the first embodiment. Thus, the layer of the ESD element through which a current flows is small, so that heat may be generated to break down the ESD element with a small amount of current. Therefore, the use of a bulk substrate, which offers a high resistance, as in the case of the first embodiment is expected to improve the ESD characteristic compared to the use of an SOI substrate.

The region forming the protected element B need not have the same substrate structure as that of the region forming the protective element A. Therefore, in the region forming the protected element B, for example, a semiconductor substrate of normal resistivity (for example, at most 20 Ω·cm) may be used or the P-well layer 13 may be omitted.

Second Embodiment

A second embodiment is an example in which the operating voltage is reduced by surrounding the well in the surface of the substrate with a well of another conductivity type.

Figure 11:
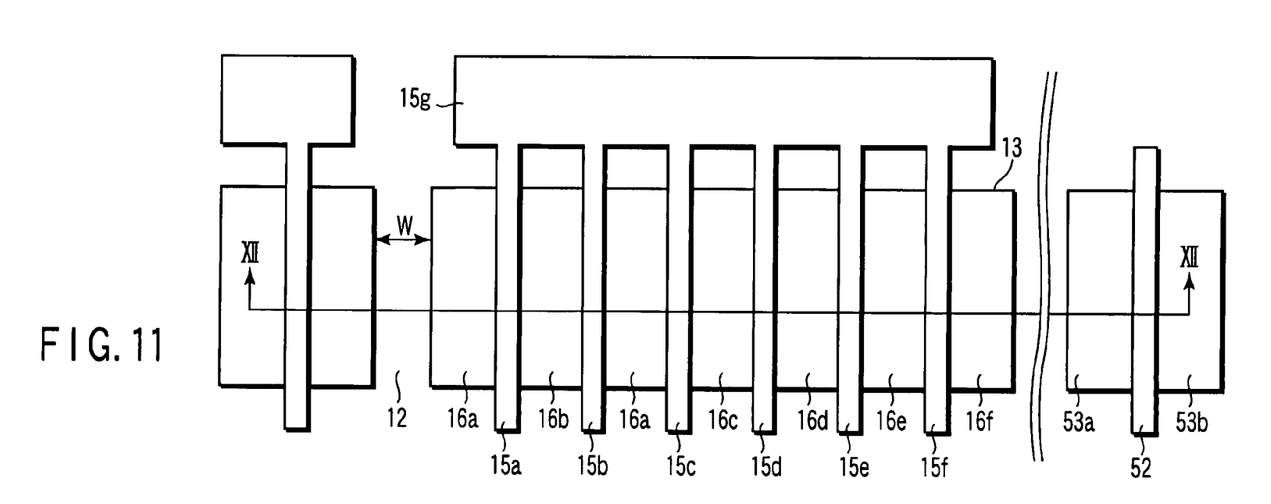
FIG. 11 is a plan view showing a semiconductor device according to a second embodiment of the present invention.
Figure 12:
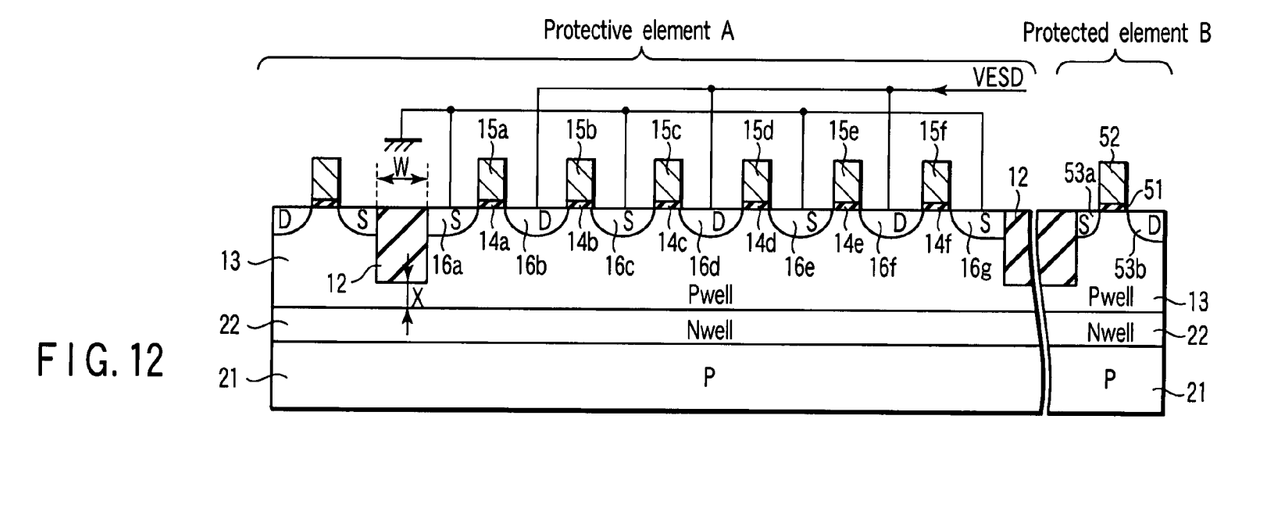
FIG. 12 is a sectional view of a semiconductor device taken along line XII—XII in FIG. 11.

FIG. 11 is a plan view of a semiconductor device according to the second embodiment of the present invention. FIG. 12 is a sectional view of the semiconductor device taken along line XII—XII in FIG. 11. Again, as the protective example A, a GGNMOS will be described by way of example as in the case of the first embodiment.

As shown in FIGS. 11 and 12, the second embodiment differs from the first embodiment in that a semiconductor substrate 21 has a normal resistivity (for example, at most 20 Ω·cm) and has the P-well layer 13 formed in its surface and that an N-well layer 22 is formed deeper than the P-well layer 13 so as to surround the P-well layer 13. Accordingly, in the second embodiment, the P-well layer 13 in the surface of the semiconductor substrate 11 is surrounded by the N-well layer 22 of a conductivity type different from that of the P-well layer 13. This reduces the operating voltage of the protective element A.

Figure 13:
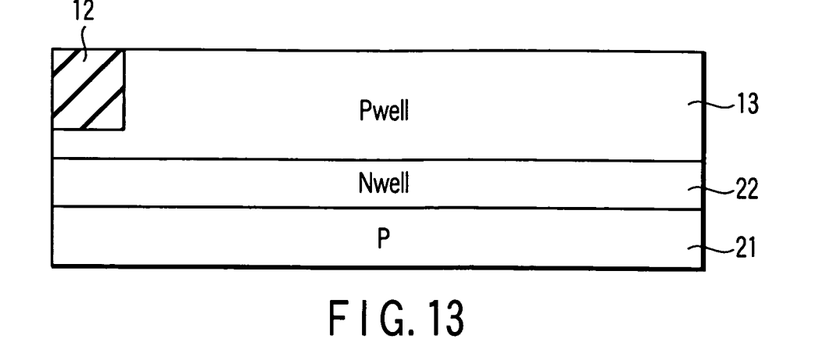
FIGS. 13 to 15 are sectional views showing a process of manufacturing a semiconductor device according to the second embodiment of the present invention.
Figure 14:
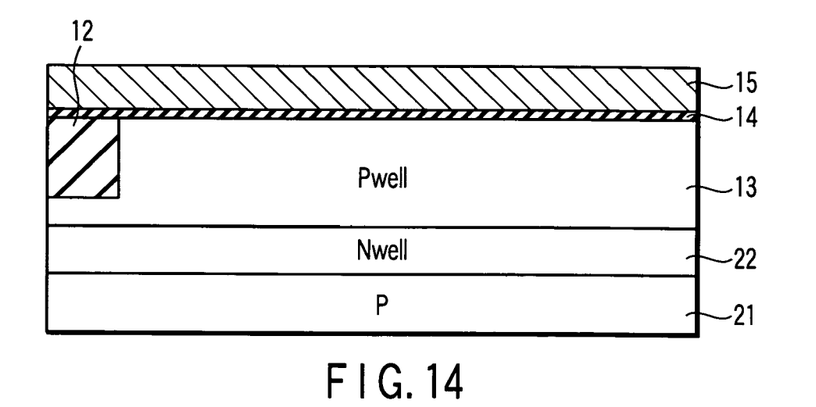
Figure 15:
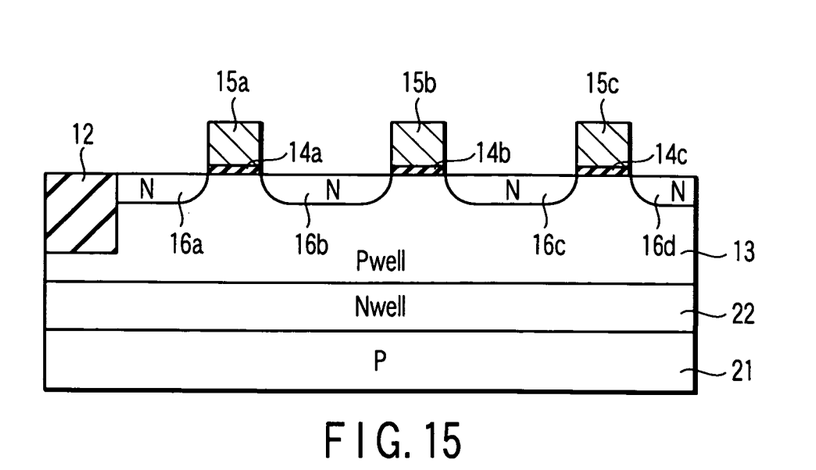

FIGS. 13 to 15 are sectional views of a process of manufacturing a semiconductor device according to the second embodiment of the present invention. Description will be given below of the method of manufacturing a semiconductor device according to the second embodiment.

First, as shown in FIG. 13, the normal semiconductor substrate (for example, P-type silicon substrate) 21 of resistivity at most 20 Ω·cm is provided. The element isolating region 12 composed of an insulating film is formed in the semiconductor substrate 11. Then, the N-well 22 is formed in the semiconductor substrate 21. The P-well layer 13 and a channel region (not shown) are formed on the N-well region 22.

Then, as shown in FIG. 14, the gate insulating film 14 is formed on the semiconductor substrate 21. The gate electrode material 15 is formed on the gate insulating film 14.

Then, as shown in FIG. 15, the gate insulating film 14 and the gate electrode material 15 are patterned. The gate electrodes 15a, 15b, and 15c are formed on the semiconductor substrate 21 via the gate insulating films 14a, 14b, and 14c. Subsequently, the N-type source/drain regions 16a, 16b, 16c, and 16d are formed in the P-well layer 13 under opposite ends of the gate electrodes 15a, 15b, and 15c, respectively. Thus, a MISFET is formed.

According to the second embodiment, the P-well layer 13 is surrounded by the N-well layer of the conductivity type different from that of the P-well layer 13. Consequently, a pn junction can be formed to suppress coupling to the substrate. Thus, the operating voltage of the protective element A can be reduced.

Moreover, by sandwiching the N-well layer between the P-well layer 13 and the substrate 21, the voltage in the P-well layer 13 can be maintained high. This makes it possible to increase the operating voltage regardless of the resistance of the substrate.

The region forming the protected element B need not have the same substrate structure as that of the region forming the protective element A. Therefore, in the region forming the protected element B, for example, the P-well layer 13 or N-well layer 22 may be omitted.

Third Embodiment

A third embodiment is an example in which the operating voltage is reduced by implanting protons in the area where the protective element A is formed, to increase the substrate resistance.

Figure 16:
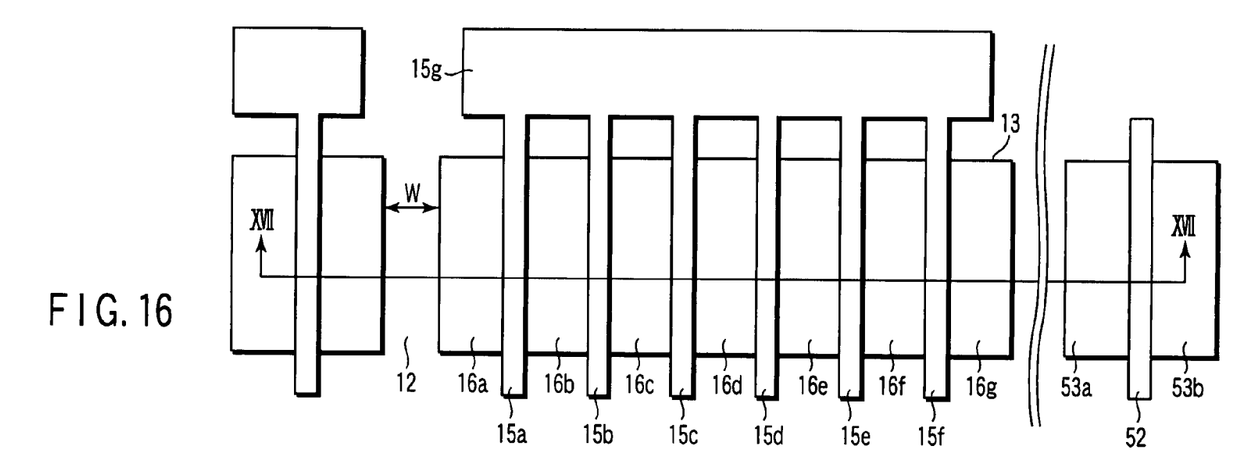
FIG. 16 is a plan view showing a semiconductor device according to a third embodiment of the present invention.
Figure 17:
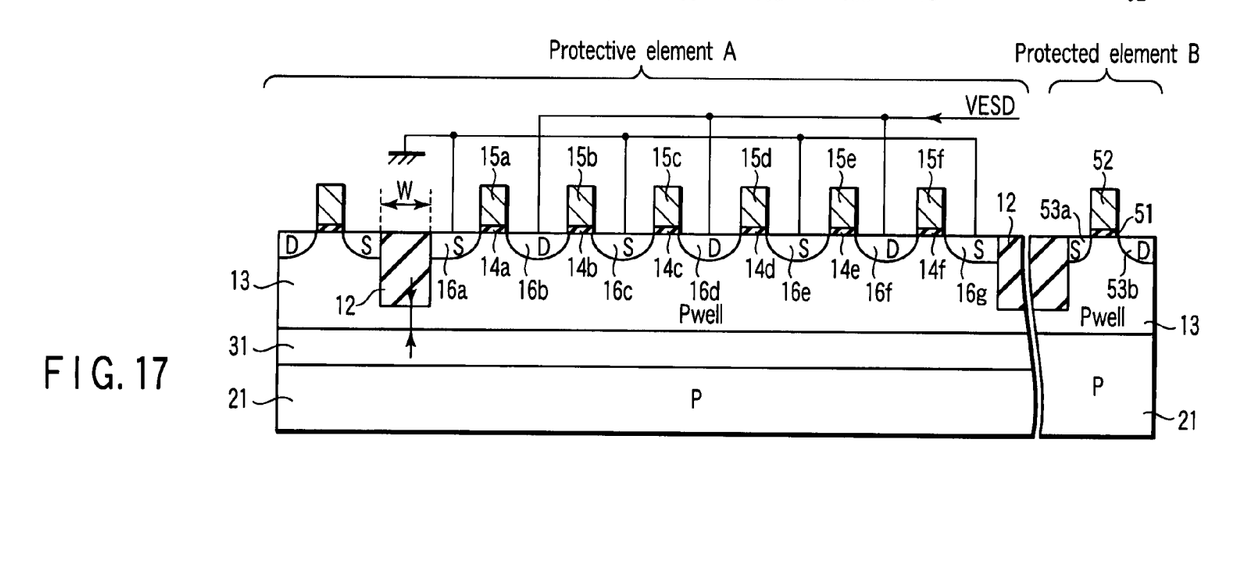
FIG. 17 is a sectional view of a semiconductor device taken along line XVII—XVII in FIG. 16.

FIG. 16 is a plan view of a semiconductor device according to the third embodiment of the present invention. FIG. 17 is a sectional view of the semiconductor device taken along line XVII—XVII in FIG. 16. Again, as the protective example A, a GGNMOS will be described by way of example as in the case of the first embodiment.

As shown in FIGS. 16 and 17, the third embodiment differs from the first embodiment in that the semiconductor substrate 21 has a normal resistivity (for example, at most 20 Ω·cm) and has the P-well layer 13 formed in its surface and that a high-resistance layer 31 formed by the injection of protons is provided deeper than the P-well layer 13. The high-resistance layer 31 offers a higher resistance than the P-well layer 13 and semiconductor substrate 21. The high-resistance layer 31 has a resistivity of, for example, 500 Ω·cm.

Figure 18:
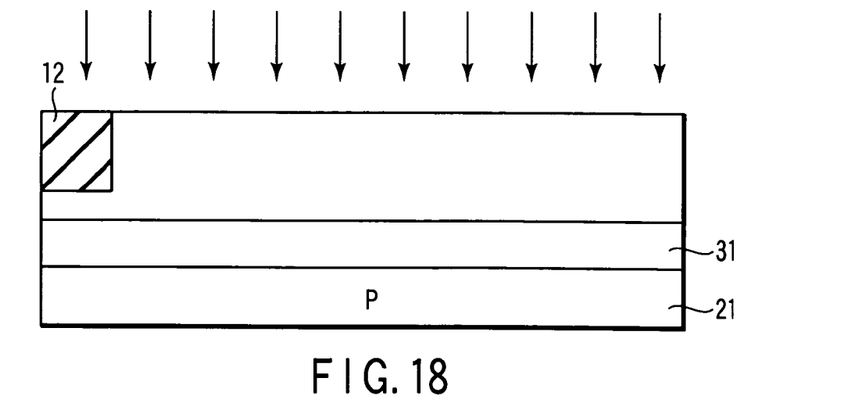
FIGS. 18 to 20 are sectional views showing a process of manufacturing a semiconductor device according to the third embodiment of the present invention.
Figure 19:
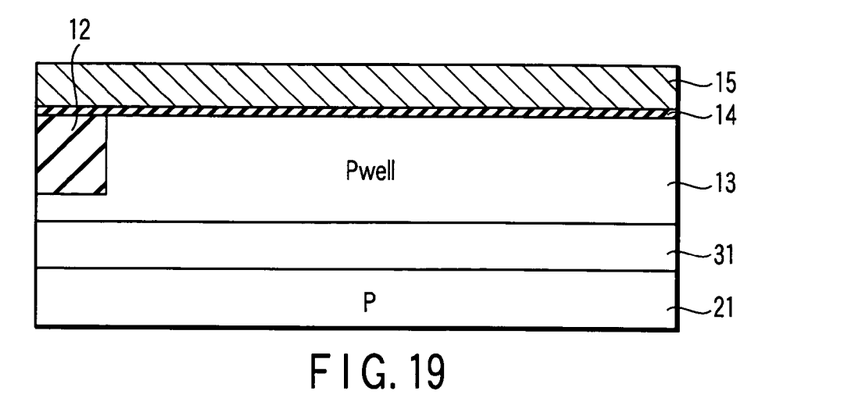
Figure 20:
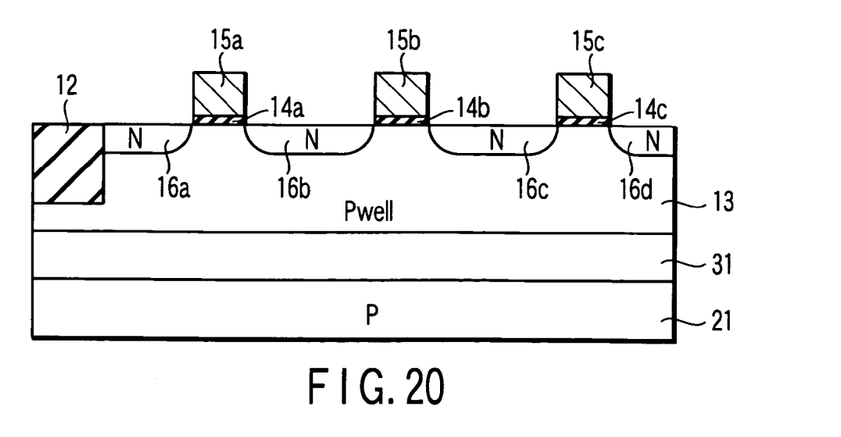

FIGS. 18 to 20 are sectional views of a process of manufacturing a semiconductor device according to the third embodiment of the present invention. Description will be given below of the method of manufacturing a semiconductor device according to the third embodiment.

First, as shown in FIG. 18, the normal semiconductor substrate (for example, P-type silicon substrate) 21 of resistivity at most 20 Ω·cm is provided. The element isolating region 12 composed of an insulating film is formed in the semiconductor substrate 11. Then, protons are implanted in the area where the protective element A is formed, to form the high-resistance layer 31 in the semiconductor substrate 21.

Then, as shown in FIG. 19, the P-well layer 13 and a channel region (not shown) are formed in the surface of the semiconductor substrate 21. Then, the gate insulating film 14 is formed on the semiconductor substrate 21. The gate electrode material 15 is formed on the gate insulating film 14.

Then, as shown in FIG. 20, the gate insulating film 14 and the gate electrode material 15 are patterned. The gate electrodes 15a, 15b, and 15c are formed on the semiconductor substrate 21 via the gate insulating films 14a, 14b, and 14c. Subsequently, the N-type source/drain regions 16a, 16b, 16c, and 16d are formed in the P-well layer 13 under opposite ends of the gate electrodes 15a, 15b, and 15c, respectively. Thus, a MISFET is formed.

According to the third embodiment, the substrate resistance can be increased by forming the high-resistance layer 31 by implanting protons in the region forming the protective element A. Consequently, the operating voltage of the protective element A can be reduced.

Moreover, by adjusting the position at which the protons are implanted, it is possible to increase the substrate resistance only in the region forming the protective element A.

Fourth Embodiment

A fourth embodiment is an example in which the operating voltage is reduced by forming a cavity portion under the well layer to increase the substrate resistance.

Figure 21:
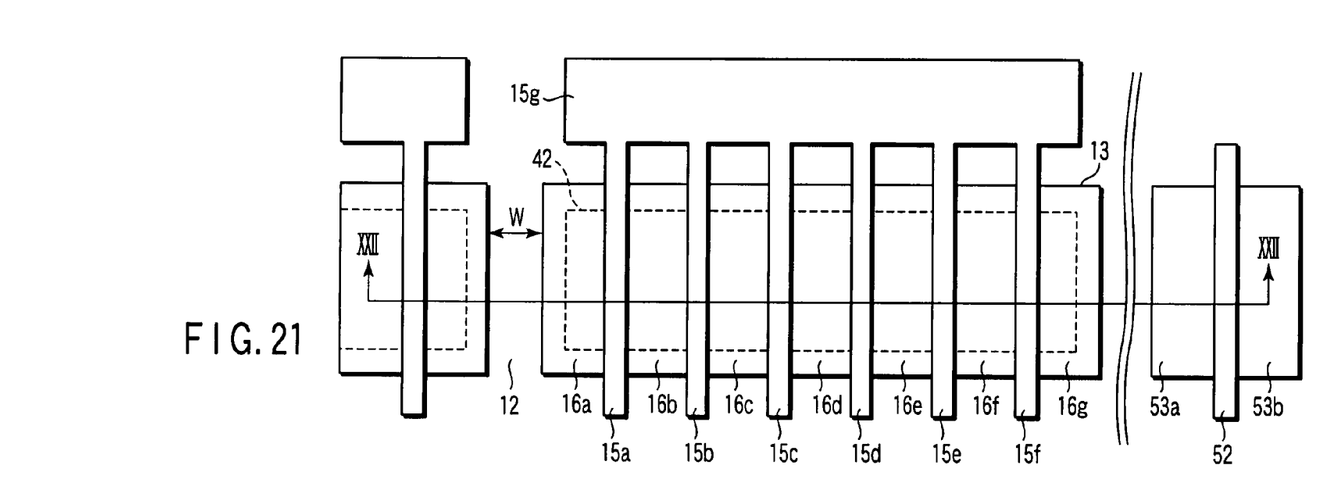
FIG. 21 is a plan view showing a semiconductor device according to a fourth embodiment of the present invention.
Figure 22:
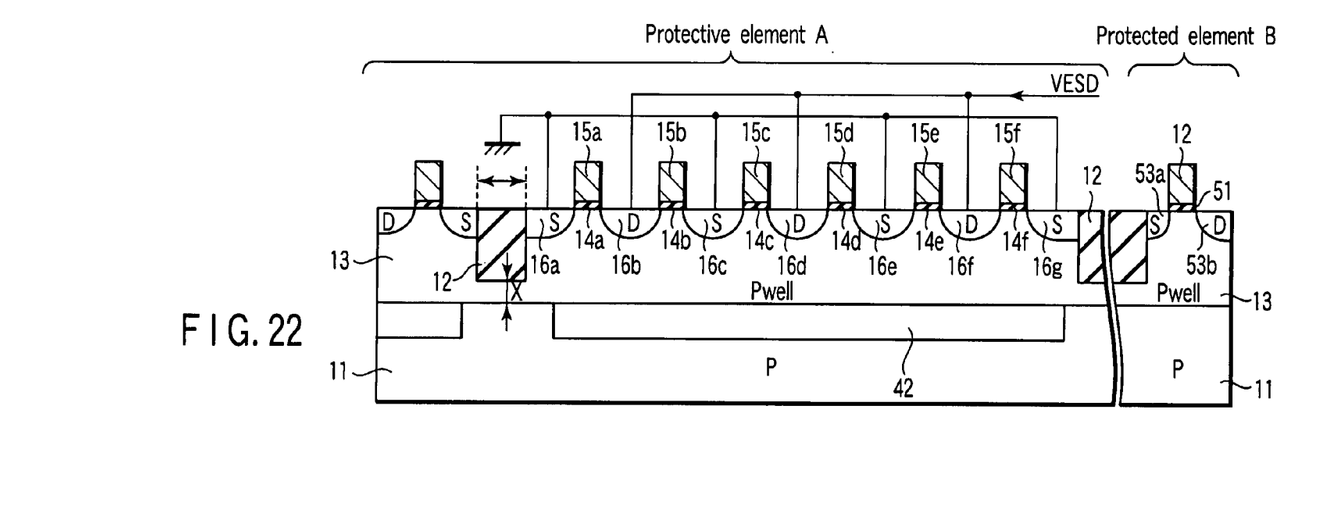
FIG. 22 is a sectional view of a semiconductor device taken along line XXII—XXII in FIG. 21.

FIG. 21 is a plan view of a semiconductor device according to the fourth embodiment of the present invention. FIG. 22 is a sectional view of the semiconductor device taken along line XXII—XXII in FIG. 21. Again, as the protective example A, a GGNMOS will be described by way of example as in the case of the first embodiment.

As shown in FIGS. 21 and 22, the fourth embodiment differs from the first embodiment in that the semiconductor substrate 21 has a normal resistivity (for example, at most 20 Ω·cm) and that a cavity portion 42 is formed under the P-well layer 13. The cavity portion 42 spans the plurality of gate electrodes 15a, 15b, 15c, 15d, 15e, and 15f to form one continuous cavity.

FIGS. 23 to 26 are sectional views of a process of manufacturing a semiconductor device according to the fourth embodiment of the present invention. Description will be given below of the method of manufacturing a semiconductor device according to the fourth embodiment.

Figure 23:
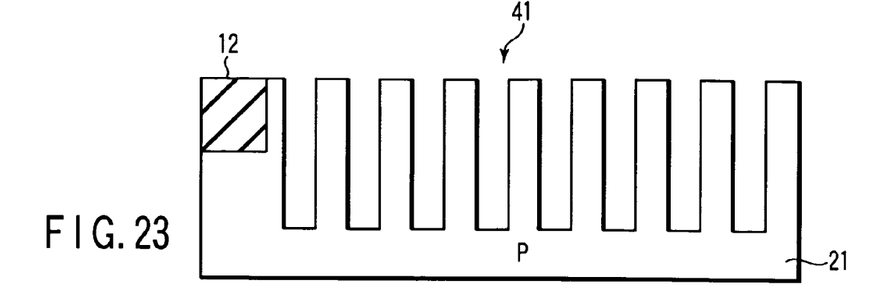
FIGS. 23 to 26 are sectional views showing a process of manufacturing a semiconductor device according to the fourth embodiment of the present invention.

First, as shown in FIG. 23, the normal semiconductor substrate (for example, P-type silicon substrate) 21 of resistivity at most 20 Ω·cm is provided. The element isolating region 12 composed of an insulating film is formed in the semiconductor substrate 11. Then, a plurality of trenches 41 are formed in the region constituting the protective element A.

Figure 24:
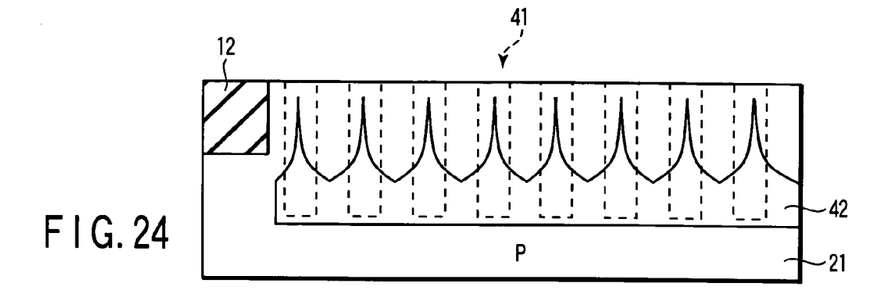
Figure 25:
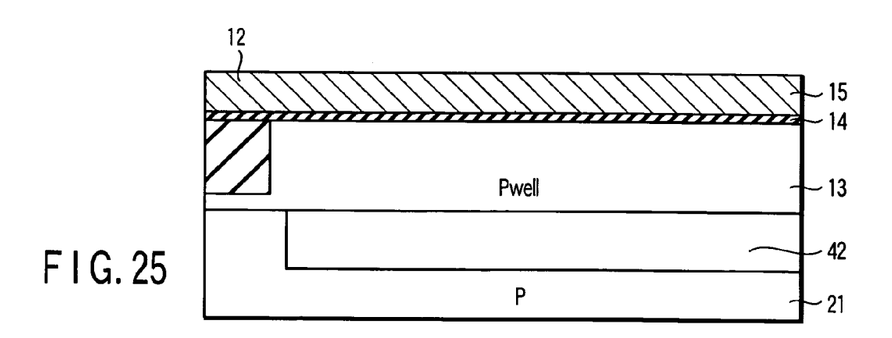

Then, as shown in FIG. 24, hydrogen annealing is carried out to gradually expand the bottom surface of each trench 41 in the horizontal direction, while contracting the top surface of the trench 41. As a result, as shown in FIG. 25, the cavity portion 42 composed of the contiguous trenches 41 is formed under the protective element A.

Then, the P-well layer 13 is formed in the surface of the semiconductor substrate 21. Then, the gate insulating film 14 is formed on the semiconductor substrate 21. The gate electrode material 15 is formed on the gate insulating film 14.

Figure 26:
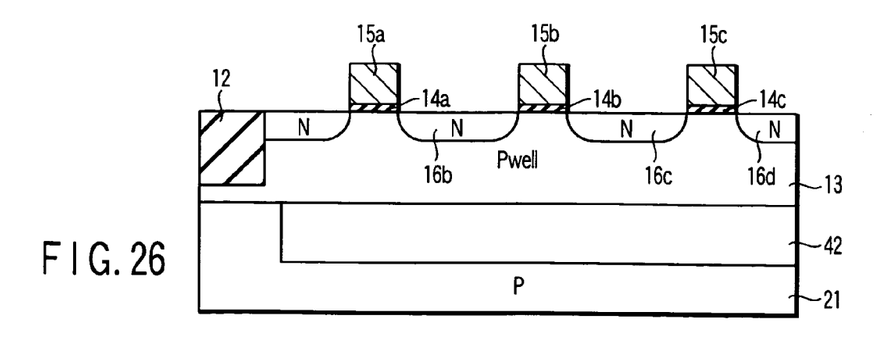

Then, as shown in FIG. 26, the gate insulating film 14 and the gate electrode material 15 are patterned. The gate electrodes 15a, 15b, and 15c are formed on the semiconductor substrate 21 via the gate insulating films 14a, 14b, and 14c. Subsequently, the N-type source/drain regions 16a, 16b, 16c, and 16d are formed in the P-well layer 13 under opposite ends of the gate electrodes 15a, 15b, and 15c, respectively. Thus, a MISFET is formed.

According to the fourth embodiment, the substrate resistance can be increased by forming the cavity portion 42 under the well layer 13 of the protective element A. Consequently, the operating voltage of the protective element A can be reduced.

Moreover, by adjusting the position at which the cavity portion 42 is formed, it is possible to increase the substrate resistance only in the region forming the protective element A.

The present invention is not limited to the above described embodiments. In implementation, the embodiments can be varied without departing from the spirit of the present invention.

For example, a GGMOS, a kind of MISFET, has been illustrated as the protective element A. However, the present invention is not limited to this aspect. For example, similar effects can be produced by an element in which a current from an ESD element passes through an N-P-N of an NMOS. Accordingly, the present invention is applicable to such an element.

Furthermore, the protective element A can be located at various positions. For example, the protective element A may be located between an internal circuit and an input terminal (the protective element A is closer to the input terminal than to the internal circuit), between the power sources, between the grounds, between the power source and the ground, or the like.

Figure 27:
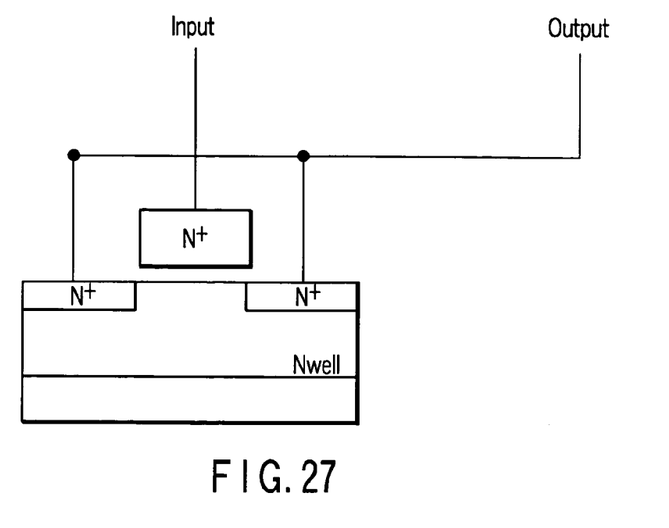
FIG. 27 is a schematic diagram showing a protected element according to each embodiment of the present invention.

A MOS transistor in the internal circuit, a kind of MISFET, has been illustrated as the protected element B. However, the present invention is not limited to this aspect. For example, the protected element B may be a variable capacity element of a MOS type (see FIG. 27), a bipolar transistor in a BICMOS circuit, or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a semiconductor substrate having a resistivity of at least 30 Ω·cm and including a first region and a second region;
a first MISFET formed on the first region of the semiconductor substrate to function as a protective element; and
a second MISFET formed on the second region of the semiconductor substrate and having a gate insulating film protected by the first MISFET from a gate insulating breakdown voltage, which the gate insulating film has a thickness of less than 4.0 nm.

2. The semiconductor device according to claim 1, wherein the first MISFET is a GGMOS transistor.

3. The semiconductor device according to claim 1, further comprising:
a well layer formed in a surface of the first region of the semiconductor substrate; and
an element isolating region formed in the well layer, wherein a following equation is given $$X \leq \tfrac{1}{2}W$$

where X is the distance from a bottom surface of the element isolating region to a bottom surface of the well layer and W is the width of the element isolating region in a horizontal direction with respect to the semiconductor substrate.

4. The semiconductor device according to claim 1, further comprising a well layer formed in a surface of the first region of the semiconductor substrate,
wherein the resistivity R1 of the semiconductor substrate and the resistivity R2 of the well layer meet a relationship $R1/R2 \geq 100$.

5. The semiconductor device according to claim 1, wherein a gate electrode of the second MISFET has a gate length of at most 0.18 μm.

6. The semiconductor device according to claim 1, further comprising:
an element isolating region formed between the first and second regions of the semiconductor substrate and separating the first MISFET and the second MISFET from each other.

7. A semiconductor device comprising:
a semiconductor substrate having a first region and a second region;
a well layer formed in a surface of the first region of the semiconductor substrate;
a cavity portion formed under the well layer in the first region of the semiconductor substrate;
a first MISFET formed on the well layer to function as a protective element; and
a second MISFET formed on the second region of the semiconductor substrate and having a gate insulating film protected by the first MISFET from a gate insulating breakdown voltage.

8. The semiconductor device according to claim 7, wherein the well layer is a P-type layer.

9. The semiconductor device according to claim 7, further comprising:
an element isolating region formed between the first and second regions of the semiconductor substrate and separating the first MISFET and the second MISFET from each other.

10. A semiconductor device comprising:
a semiconductor substrate having a first region and a second region;
a well layer formed in a surface of the first region of the semiconductor substrate;
a high-resistance layer located in the first region of the semiconductor substrate formed deeper than the first well layer by injection of protons and having a resistance higher than a resistance of the well layer;
a first MISFET formed on the well layer to function as a protective element; and
a second MISFET formed on the second region of the semiconductor substrate and having a gate insulating film protected by the first MISFET from a gate insulating breakdown voltage.

11. The semiconductor device according to claim 10, further comprising:
an element isolating region formed between the first and second regions of the semiconductor substrate and separating the first MISFET and the second MISFET from each other.

12. A method of manufacturing a semiconductor device, the method comprising forming a first MISFET functioning as a protective element, on a first region of a semiconductor substrate having a resistivity of at least 30 Ω·cm and forming a second MISFET on a second region of the semiconductor substrate, the second MISFET having a gate insulating film protected by the first MISFET from a gate insulting breakdown voltage, the gate insulating film having a thickness of less than 4.0 nm.

13. The method of manufacturing a semiconductor device according to claim 12, wherein the first MISFET is a GGMOS transistor.

14. The method of manufacturing a semiconductor device according to claim 12, the method further comprising:
forming a well layer in a surface of the first region of the semiconductor substrate; and
forming an element isolating region in the well layer, wherein a following equation is given $$X \leq \tfrac{1}{2}W$$

where X is the distance from a bottom surface of the element isolating region to a bottom surface of the well layer and W is the width of the element isolating region in a horizontal direction with respect to the semiconductor substrate.

15. The method of manufacturing a semiconductor device according to claim 12, the method further comprising:
forming a well layer in a surface of the first region of the semiconductor substrate,
wherein the resistivity R1 of the semiconductor substrate and the resistivity R2 of the well layer meet a relationship $R1/R2 \geq 100$.

16. The method of manufacturing a semiconductor device according to claim 12, wherein a gate electrode of the second MISFET has a gate length of at most 0.18 μm.

17. A method of manufacturing a semiconductor device, the method comprising:
forming a high-resistance layer by injecting protons into a first region of a semiconductor substrate;
forming a well layer on the high-resistance layer, the high-resistance layer having a resistance higher than a resistance of the well layer; and
forming a first MISFET functioning as a protective element, on the well layer and forming a second MISFET on a second region of the semiconductor substrate, the second MISFET having a gate insulating film protected by the first MISFET from a gate insulating breakdown voltage.

18. The method of manufacturing a semiconductor device according to claim 17, wherein the well layer is a P-type layer.

19. A method of manufacturing a semiconductor device, the method comprising:
    forming a plurality of trenches in a first region of a semiconductor substrate;
    forming a cavity portion composed of the contiguous trenches by hydrogen annealing;
    forming well layer on the cavity portion; and
    forming a first MISFET functioning as a protective element, on the well layer and forming a second MISFET on a second region of the semiconductor substrate, the second MISFET having a gate insulating film protected by the first MISFET from a gate insulating breakdown voltage.

20. The method of manufacturing a semiconductor device according to claim 19, the method further comprising:
    forming an element isolating region between the first and second regions of the semiconductor substrate, the element isolating region separating the first MISFET and the second MISFET from each other.

* * * * *